(12) United States Patent
Yoshida et al.

(10) Patent No.: US 11,427,412 B2
(45) Date of Patent: Aug. 30, 2022

(54) SUBSTRATE CONVEYING ROBOT AND SUBSTRATE CONVEYING METHOD

(71) Applicants: KAWASAKI JUKOGYO KABUSHIKI KAISHA, Kobe (JP); KAWASAKI ROBOTICS (USA), INC., Wixom, MI (US)

(72) Inventors: Masaya Yoshida, Himeji (JP); Avish Ashok Bharwani, Santa Clara, CA (US); Ming Zeng, San Jose, CA (US); Brandon Lee, San Ramon, CA (US); Ryan Le, Milpitas, CA (US)

(73) Assignees: KAWASAKI JUKOGYO KABUSHIKI KAISHA, Kobe (JP); KAWASAKI ROBOTICS (USA), INC., Wixom, MI (US)

( * ) Notice: Subject to any disclaimer, the term of this patent is extended or adjusted under 35 U.S.C. 154(b) by 533 days.

(21) Appl. No.: 16/407,601

(22) Filed: May 9, 2019

(65) Prior Publication Data
US 2020/0354161 A1    Nov. 12, 2020

(51) Int. Cl.
*B65G 47/90* (2006.01)
*B25J 9/16* (2006.01)
*B25J 15/10* (2006.01)

(52) U.S. Cl.
CPC .......... *B65G 47/905* (2013.01); *B25J 9/1664* (2013.01); *B25J 15/10* (2013.01)

(58) Field of Classification Search
CPC combination set(s) only.
See application file for complete search history.

(56) References Cited

U.S. PATENT DOCUMENTS

| 2011/0037492 | A1  | 2/2011 | Seubert et al. |
| 2017/0062264 | A1* | 3/2017 | Tang ................. H01L 21/67781 |
| 2018/0019154 | A1* | 1/2018 | Yoshida ............... H01L 21/681 |
| 2018/0029237 | A1* | 2/2018 | Sugawara ......... H01L 21/67259 |

FOREIGN PATENT DOCUMENTS

| JP | 2010-527515 A | 8/2010 |
| JP | 2017-092246 A | 5/2017 |
| JP | 2019-141931 A | 8/2019 |

* cited by examiner

*Primary Examiner* — Kyle O Logan
(74) *Attorney, Agent, or Firm* — Oliff PLC

(57) ABSTRACT

A robot control unit for a substrate conveying robot raises a hand from a first lower position below a first target position at which the hand picks up a substrate to a first upper position above the first target position, and displaces at least one of a plurality of joints in one direction, in a first interval from the first lower position to a first intermediate position between the first lower position and the first target position.

9 Claims, 6 Drawing Sheets

FIG. 6

| Pick-up speed (PA get speed) | 1% | 5% | 15% |
|---|---|---|---|
| Improvement ratio repeatability | 18% | 22% | 23% |

SUBSTRATE CONVEYING ROBOT AND SUBSTRATE CONVEYING METHOD

BACKGROUND OF THE INVENTION

Field of the Invention

The present invention relates to a substrate conveying robot and a substrate conveying method.

Description of Related Art

Conventionally, a robot for transferring wafers is known. The robot disclosed in JP 2010-527515 A takes out a wafer housed in a wafer carrier such as a FOUP, and then moves the wafer to an aligner. The robot then moves the wafer roughly aligned in the aligner to a stage. Then, alignment is performed precisely on the stage, and processing such as wafer testing is performed.

SUMMARY OF THE INVENTION

However, the robot disclosed in JP 2010-527515 A suffers from the problem that the wafer can become misaligned during the conveyance from the aligner to the stage and therefore precise alignment on the stage is necessary.

In order to address the above-mentioned problem, a substrate conveying robot according to an aspect of the present invention includes: a base; a hand that has a substrate mounting portion on which a substrate is mounted; an articulated robot arm that has a base end connected to the base and a leading end connected to the hand, and includes a plurality of joints; a robot arm drive mechanism that includes a drive source and a driving force transmission unit that transmits driving force of the drive source to the joints of the articulated robot arm to displace the joints; and a robot control unit that controls operation of the drive source so that the hand assumes a target orientation at a target position, in which the robot control unit raises the hand from a first lower position below a first target position at which the hand picks up the substrate to a first upper position above the first target position, and displaces at least one of the plurality of joints in one direction, in a first interval from the first lower position to a first intermediate position between the first lower position and the first target position.

With this configuration, it is possible to improve the positioning accuracy of the hand.

The above object, other objects, features and advantages of the present invention will be apparent from the following detailed description of a preferred embodiment with reference to the accompanying drawings.

BRIEF DESCRIPTION OF THE DRAWINGS

FIG. 6 shows a measurement result on positioning error of the substrate conveying robot of the substrate processing system of FIG. 1.

DETAILED DESCRIPTION OF PREFERRED EMBODIMENT

Figure 1:
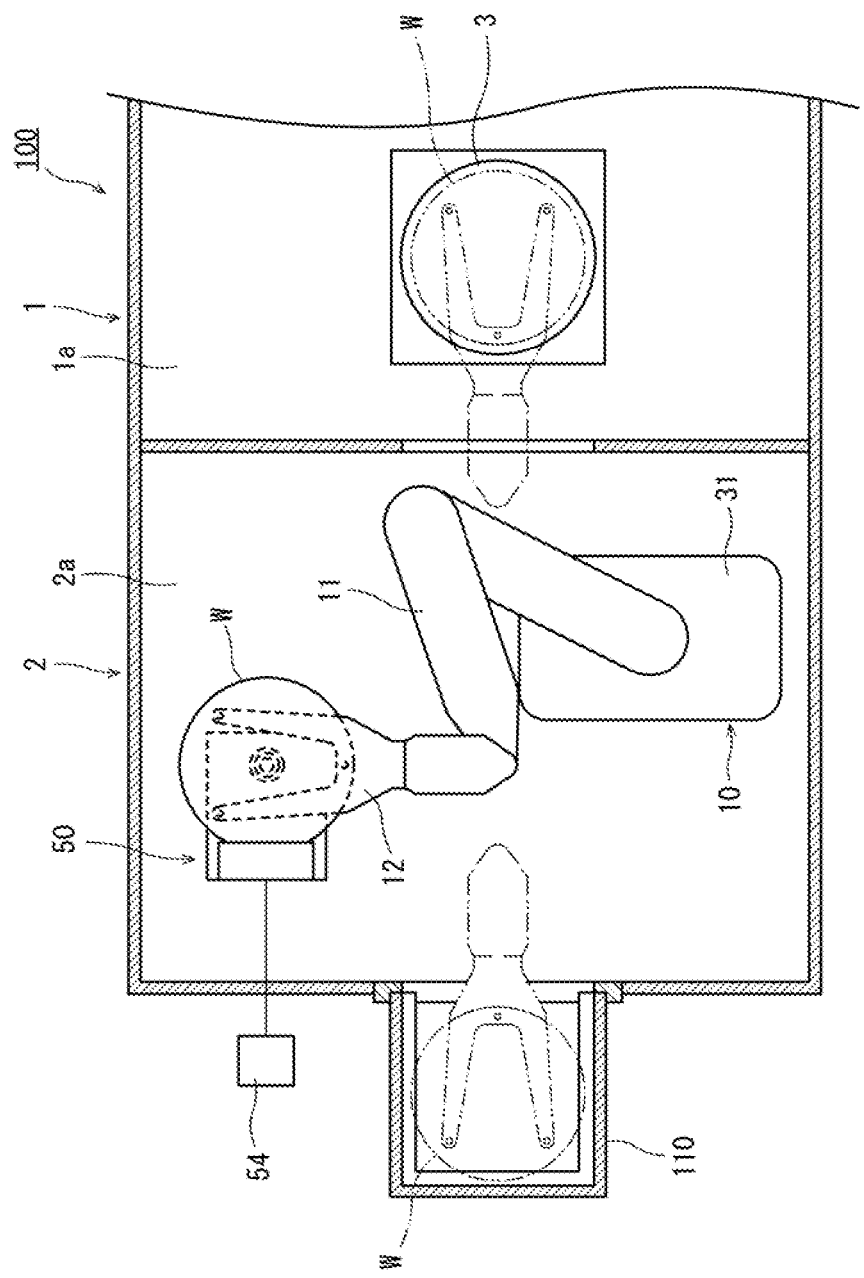
FIG. 1 is a plan view showing a configuration example of a substrate processing system according to an embodiment.

A substrate conveying robot according to an aspect includes: a base; a hand that has a substrate mounting portion on which a substrate is mounted; an articulated robot arm that has a base end connected to the base and a leading end connected to the hand, and includes a plurality of joints; a robot arm drive mechanism that includes a drive source and a driving force transmission unit that transmits driving force of the drive source to the joints of the articulated robot arm to displace the joints; and a robot control unit that controls operation of the drive source so that the hand assumes a target orientation at a target position, in which the robot control unit raises the hand from a first lower position below a first target position at which the hand picks up the substrate to a first upper position above the first target position, and displaces at least one of the plurality of joints in one direction, in a first interval from the first lower position to a first intermediate position between the first lower position and the first target position.

With this configuration, it is possible to improve the positioning accuracy of the hand.

The robot control unit may displace the joints in one direction in the first interval.

With this configuration, it is possible to further improve the positioning accuracy of the hand.

The substrate conveying robot may transfer the substrate held by an aligner to a stage, and the first target position may be a position to pick up the substrate held by the aligner.

With this configuration, it is possible to suppress the position of the substrate aligned by the aligner from deviating when the substrate is picked up from the aligner.

A substrate conveying robot according to another aspect includes: a base; a hand that has a substrate mounting portion on which a substrate is mounted; an articulated robot arm that has a base end connected to the base and a leading end connected to the hand, and includes a plurality of joints; a robot arm drive mechanism that includes a drive source and a driving force transmission unit that transmits driving force of the drive source to the joints of the articulated robot arm to displace the joints; and a robot control unit that controls operation of the drive source so that the hand assumes a target orientation at a target position, in which the robot control unit lowers the hand from a second upper position above a second target position at which the hand places the substrate on a stage to a second lower position below the second target position, and displaces at least one of the plurality of joints in one direction, in a second interval from the second upper position to a second intermediate position between the second upper position and the second target position.

With this configuration, it is possible to improve the positioning accuracy of the hand and improve the throughput of a substrate processing facility. It is also possible to suppress the position of the substrate aligned by the aligner from deviating when the substrate is placed on the stage.

The robot control unit may displace the joints in one direction in the second interval.

With this configuration, it is possible to further improve the positioning accuracy of the hand.

The driving force transmission unit may include at least one of a gear, toothed belt, and chain that transmit the driving force to the joints.

With this configuration, it is possible to suppress the decrease in the positioning accuracy of the hand due to backlash.

Hereinafter, an embodiment will be described with reference to the drawings. It should be noted that the present invention is not limited to this embodiment. It should be also noted that in the following description, identical or corresponding elements depicted in all the drawings are denoted with identical reference marks; therefore, the duplicate description thereof will not be given here.

FIG. 1 is a plan view showing a configuration example of a substrate processing system 100 according to an embodiment.

As shown in FIG. 1, the substrate processing system 100 includes a substrate processing facility 1 and a substrate transfer facility 2, and is configured in such a manner that a plurality of wafers W conveyed to the substrate processing system 100 in a state of being housed in a carrier 110 referred to as a front opening unified pod (FOUP) are each taken from the carrier 110 by the substrate transfer facility 2 and transferred to a stage 3 of the substrate processing facility 1. At this time, the substrate transfer facility 2 adjusts the orientation of the wafer W to mount the wafer W on the stage 3. Then, in the substrate processing facility 1, predetermined processing for the wafer W is performed. In this embodiment, in the substrate processing facility 1, a test for evaluating the characteristics of each die circuit is conducted with respect to the silicon wafer W having multiple dies formed thereon. Then, after the predetermined processing for the wafer W is performed, the substrate transfer facility 2 transfers the wafer W from the stage 3 to the carrier 110 to house the wafer W in the carrier 110 again. In order to prevent adhesion of particles to the wafer W, or the like in these processes, the substrate processing system 100 includes a device (not shown) for keeping high the cleanliness of a processing space 1a of the substrate processing facility 1 and a preparation space 2a of the substrate transfer facility 2. It should be noted that a substrate to be processed by the substrate processing system 100 is not limited to the wafer but may be a glass substrate.

Figure 2:
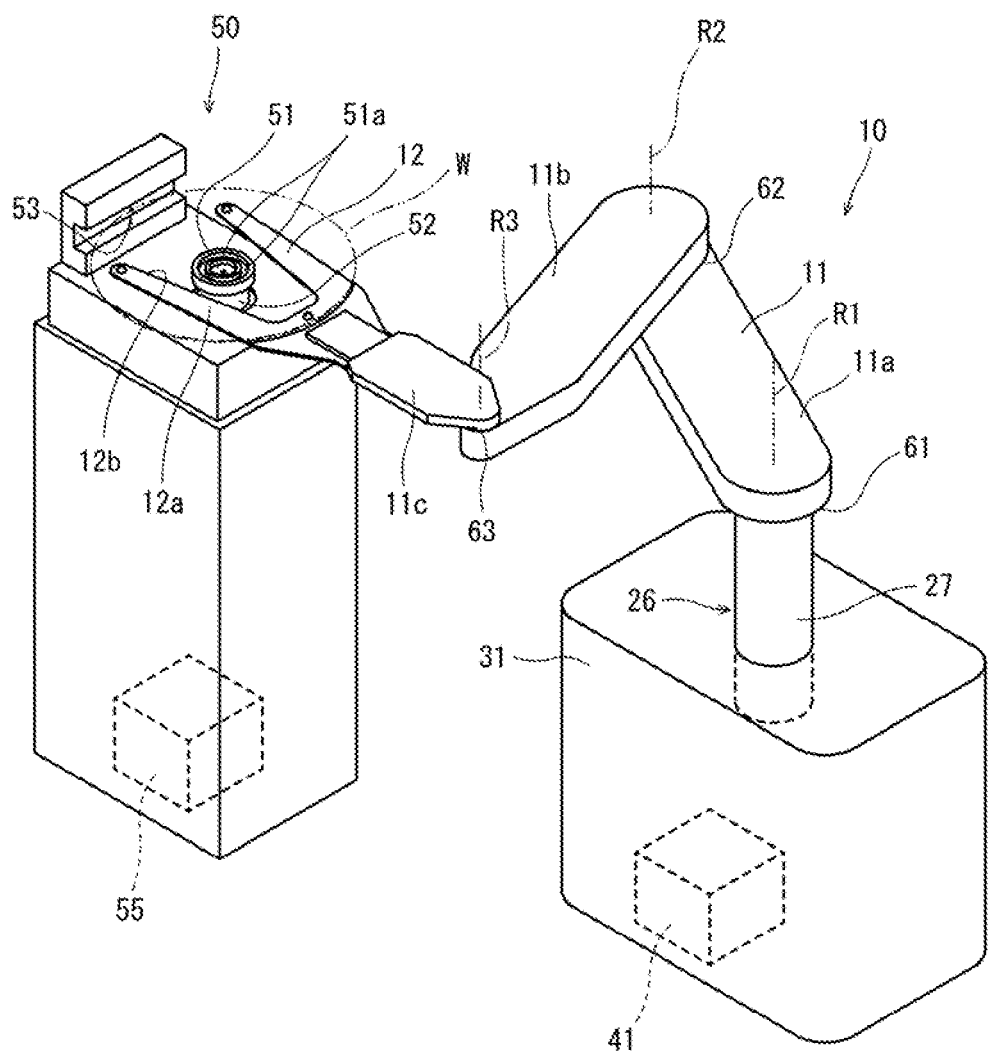
FIG. 2 is a perspective view showing a configuration example of a substrate transfer facility of the substrate processing system of FIG. 1.
Figure 3:
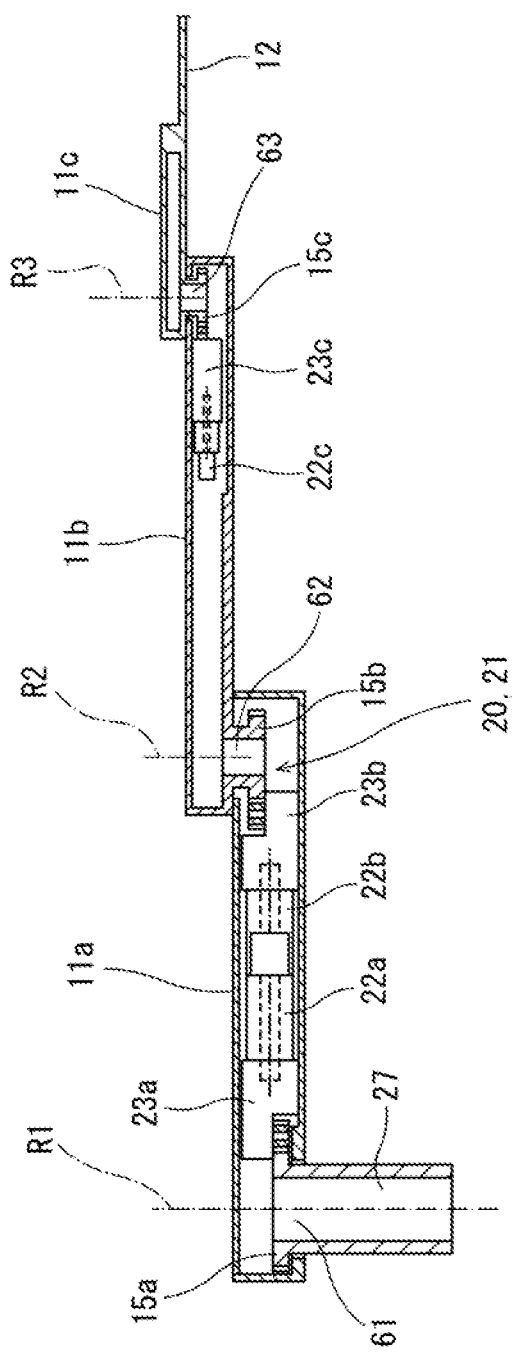
FIG. 3 is a sectional view showing a configuration example of a drive mechanism for a substrate conveying robot of the substrate processing system of FIG. 1.

FIG. 2 is a perspective view showing a configuration example of the substrate transfer facility 2. FIG. 3 is a sectional view showing a configuration example of a robot arm drive mechanism 20 of a substrate conveying robot 10.

The substrate transfer facility 2 is a facility for transferring the wafer W between the carrier 110 and the stage 3, and includes the substrate conveying robot 10. The substrate transfer facility 2 also includes an aligner 50 that adjusts the orientation of the wafer W in the process of transferring the wafer W from the carrier 110 to the stage 3.

The substrate conveying robot 10 is a robot which is disposed in the preparation space 2a of the substrate transfer facility 2, and is, for example, a SCARA horizontal articulated robot. As shown in FIG. 2, the substrate conveying robot 10 includes a robot arm 11, a hand 12, the robot arm drive mechanism 20 (see FIG. 3), a base 31, and a robot control unit 41.

The base 31 is fixed in the preparation space 2a of the substrate transfer facility 2.

The hand (blade) 12, which is a passive hand on which the wafer W is mounted, is formed in a thin plate shape extending in a horizontal direction and has, on an upper surface of the hand 12, a substrate mounting portion 12a on which the wafer W is mounted. The substrate mounting portion 12a has a notch 12b formed by largely cutting a leading end in a central portion in a width direction thereof toward a base end of the hand 12, thereby preventing the hand 12 from interfering with the stage 3, or a holding portion 51 of the aligner 50 described later, when the hand 12 is raised or lowered in order to mount the wafer W on the stage 3 or the holding portion 51 or pick up the wafer W therefrom. Alternatively, the hand 12 may be a suction hand that holds the wafer W or a workpiece by suction, such as a Bernoulli hand, or an edge grip hand that grips the edge of the wafer W.

The robot arm 11 is an articulated structure including a plurality of joints, and has a base end connected to the base 31 and a leading end connected to the hand 12. The robot arm 11 includes a plurality of links (a first link 11a, a second link 11b, and a third link 11c) which are sequentially connected via the joints in a direction from the base end to the leading end. Each of the links is formed in a shape of a hollow thick plate extending in the horizontal direction.

The first link 11a has a base end that is connected via a first joint 61 to an upper end of a movable portion 27 of a vertical drive mechanism 26 described later so as to be rotatable about a rotation axis R1. Furthermore, the second link 11b has a base end that is connected via a second joint 62 to a leading end of the first link 11a so as to be rotatable about a rotation axis R2. Further, the third link 11c has a base end that is connected via a third joint 63 to a leading end of the second link 11b so as to be rotatable about a rotation axis R3. In addition, the hand 12 is fixed to a leading end of the third link 11c. The first joint 61, the second joint 62, and the third joint 63 are all rotational joints. The rotation axes R1, R2 and R3 extend in a vertical direction parallel to one another, and the hand 12 is moved in the horizontal direction by the rotation of the joints 61, 62 and 63. In each of the joints 61, 62, and 63, for example, a rotary shaft 15 is fixed to one of the pair of links (including the movable portion 27 of the vertical drive mechanism 26) connected by the joint, and rotatably supported by the other link with a bearing interposed therebetween.

The robot arm drive mechanism 20 is a mechanism for moving the hand 12 in the horizontal direction and moving the entire robot arm 11 in the vertical direction. The robot arm drive mechanism 20 includes a horizontal drive mechanism 21 and the vertical drive mechanism 26.

As shown in FIG. 3, the horizontal drive mechanism 21 is a mechanism for driving the joints of the robot arm 11, and has, for example, a motor (drive source) 22 and a driving force transmission unit 23 which are provided so as to correspond to each of the joints. In FIG. 3, the rotary shaft, motor, and driving force transmission unit that correspond to the first joint 61 are designated with letter "a" added to the end of the reference numbers; the rotary shaft, motor, and driving force transmission unit that correspond to the second joint 62 are designated with letter "b" added to the end of the reference numbers; and the rotary shaft, motor, and driving force transmission unit that correspond to the third joint 63 are designated with letter "c" added to the end of the reference numbers.

The motor 22 is a servomotor and outputs the generated driving force as the rotational force of an output shaft. Motors 22a and 22b are disposed in an internal space of the first link 11a, and the motor 22c is disposed in an internal space of the second link 11b. The driving force transmission unit 23 transmits the driving force of the motor 22 to the corresponding joint of the robot arm 11 to displace an angular position of the joint. The driving force transmission unit 23 is, for example, a plurality of gears interposed between the output shaft of the motor 22 and the rotary shaft 15. The driving force transmission unit 23 includes, for example, a gear fixed coaxially with the output shaft of the motor 22, a gear fixed coaxially with the rotary shaft 15, and one or more gears interposed between these gears. Thus, the driving force transmission unit 23 can transmit a rotational angle of the motor 22 to the joint to position the joint. As described above, in this embodiment, the driving force transmission unit 23 transmits the driving force through the gears, but is not limited thereto. For example, the driving force transmission unit 23 may transmit the driving force through a toothed belt transmission mechanism or a chain transmission mechanism.

The vertical drive mechanism 26 is a mechanism for supporting the robot arm 11 and raising or lowering the entire robot arm 11. The vertical drive mechanism 26 includes a stationary portion (not shown) that is fixed to the base 31 and the movable portion 27 that is connected to the stationary portion so as to be capable of raising and lowering in the direction in which the rotation axis R1 extends, that is, the vertical direction. That is, the robot arm 11 is connected to the base 31 with the movable portion 27 and the stationary portion interposed therebetween. As described above, the first link 11a is rotatably connected to the movable portion 27. The vertical drive mechanism 26 also includes a servomotor (not shown), and a driving force transmission unit (not shown) that converts the driving force of the motor into force for linear motion of the movable portion 27 with respect to the stationary portion and transmits the result to the movable portion 27 to raise or lower the movable portion 27. Examples of the driving force transmission unit include a ball screw mechanism.

The robot control unit 41 controls the operation of the motor 22 of the horizontal drive mechanism 21 and the motor of the vertical drive mechanism 26 so that the hand 12 assumes a target orientation at a target position, according to a predetermined operation program or the movement command input from a user.

As shown in FIG. 2, the aligner 50 is a device for detecting the position of a notch formed in the wafer W, and aligning the wafer W based on the detection result such that at least one of the rotational position (angular position) and the horizontal position of the wafer W is located at a predetermined position. It should be noted that the aligner 50 may perform alignment based on the position of the orientation flat formed on the wafer W. The aligner 50 is disposed within the operation range of the substrate conveying robot 10 in the preparation space 2a of the substrate transfer facility 2. In this embodiment, the aligner 50 includes the holding portion 51 that sucks and holds the wafer W, a drive mechanism 52, a position detection unit 53, a vacuum source 54 (see FIG. 1), and an aligner control unit 55.

The holding portion 51 is formed in a disc shape, and has an upper surface formed with circular and annular vacuum grooves 51a coaxially arranged. In addition, the wafer W is mounted on the holding portion 51 in such a manner that a center axis of the wafer W coincides with a center axis of the holding portion 51, and the holding portion 51 supports the wafer W mounted thereon. It should be noted that a plurality of minute protrusions arranged in a circumferential direction are formed on the upper surface of the holding portion 51 so as to reduce a contact area between the wafer W and the holding portion 51. It should be noted that the notch 12b of the hand 12 is formed in a shape such that the holding portion 51 can be located on the inside of the notch 12b.

The vacuum source 54 is disposed in a space outside the substrate processing facility 1 and the substrate transfer facility 2. A flow path for transmitting a negative pressure generated in the vacuum source 54 extends from the vacuum source 54 toward the vacuum grooves 51a, and has a leading end communicating with the vacuum grooves 51a of the holding portion 51 (opening into the vacuum grooves 51a). Moreover, an opening-closing valve (not shown) for opening and closing the flow path is provided in an intermediate portion of the flow path. Furthermore, the wafer W mounted on the holding portion 51 can be sucked and held by actuating the vacuum source 54 and opening the opening-closing valve. In addition, the sucked wafer W can be released by closing the opening-closing valve.

The drive mechanism 52 causes the holding portion 51 to turn about a pivot and additionally move in the horizontal direction. The pivot is disposed so as to pass through the center of the holding portion 51.

The position detection unit 53 is a sensor for detecting an angular position at which the notch of the wafer W is located, and is disposed at the position at which the notch is located in a radial direction of the wafer W mounted on the holding portion 51. For example, the position detection unit 53 irradiates the vicinity of the outer periphery of the turned wafer W with laser light, receives reflected light or transmitted light therefrom, and detects the position of the notch based on a change in the reflected light or transmitted light.

The aligner control unit 55 receives the notch detection signal of the position detection unit 53, and controls the opening-closing valve of the flow path of the vacuum source 54, and the drive mechanism 52. Specifically, when the wafer W is mounted on the holding portion 51, the aligner control unit 55 opens the opening-closing valve to suck the wafer W to the holding portion 51. Then the aligner control unit 55 controls the drive mechanism 52 to turn the holding portion 51 and turn the wafer W. Then the position of the notch of the wafer W is detected by the position detection unit 53. Then the drive mechanism 52 is controlled to stop the turning of the holding portion 51 in such a manner that the notch of the wafer W is orientated in a predetermined direction at a predetermined position, and thereby positioning the wafer W. Then, when the substrate conveying robot 10 picks up the wafer W from the holding portion 51, the opening-closing valve is closed to release the wafer W.

The robot control unit 41 and the aligner control unit 55 are each provided with, for example, a control section that has a computing section, such as a CPU, and a storage section that has a memory, such as a ROM or a RAM. The control section may be configured from a single controller that performs centralized control, or may be configured from a plurality of controllers that perform distributed control in cooperation with one another. Furthermore, the robot control unit 41 and the aligner control unit 55 can communicate with each other, and each notify a counterpart of the completion of transfer of the wafer W to the aligner 50, the completion of alignment of the wafer W, and the like.

[Operation Example]

Next, an operation example of the substrate conveying robot 10 of the substrate processing system 100 will be described.

Figure 4:
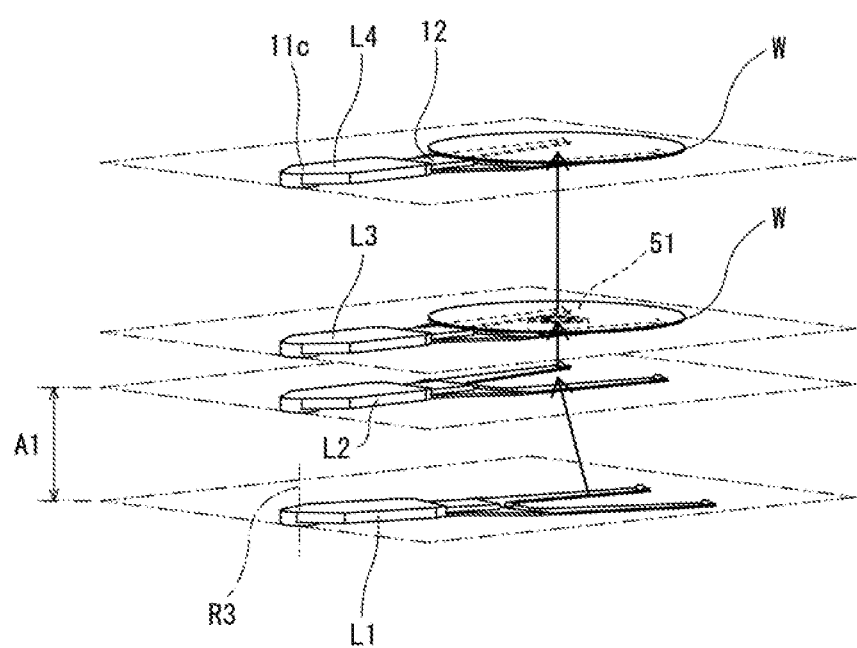
FIG. 4 shows an operation example in which the substrate conveying robot of the substrate processing system of FIG. 1 picks up a wafer from a holding portion of an aligner.
Figure 5:
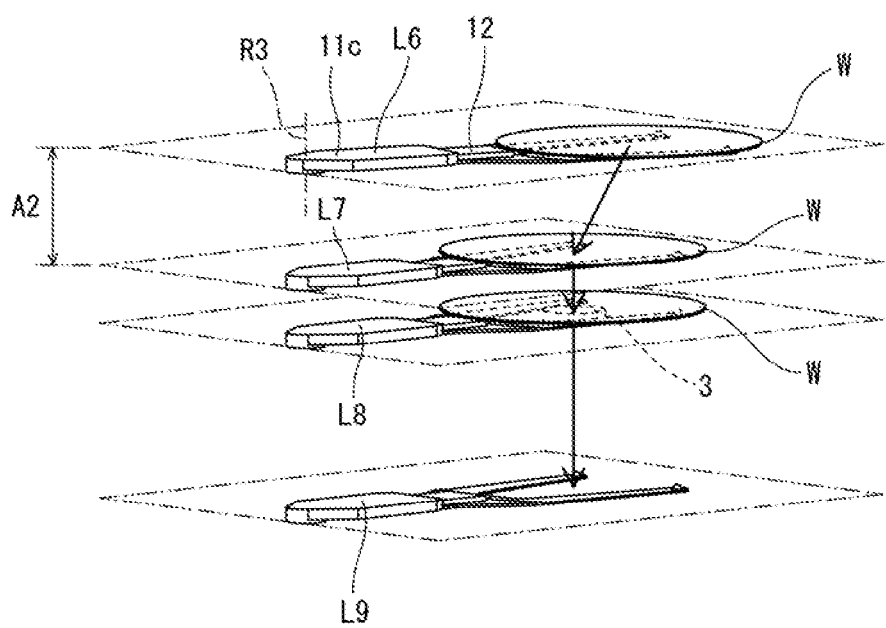
FIG. 5 shows an operation example in which the substrate conveying robot of the substrate processing system of FIG. 1 places the wafer on a stage.

FIG. 4 shows an operation example of picking up the wafer W from the holding portion 51 when the wafer W aligned by the aligner 50 is transferred to the stage 3. In addition, FIG. 5 shows an operation example of placing the wafer W on the stage 3. It should be noted that in FIGS. 4 and 5, the first link 11a and the second link 11b are not shown, and the operation of the hand 12 is exaggerated.

Firstly, the robot control unit 41 positions the substrate mounting portion 12a immediately below the wafer W to be transferred which is housed in the carrier 110, raises the hand 12, and picks up the wafer W. Thus, the wafer W is mounted on the substrate mounting portion 12a.

Next, the robot control unit 41 moves the hand 12 along a preset path and positions the hand 12 such that the substrate mounting portion 12a is located above the holding portion 51 of the aligner 50. Then the robot control unit 41 controls the vertical drive mechanism 26 to lower the hand 12. Thus, the wafer W mounted on the substrate mounting portion 12a is mounted on the holding portion 51 of the aligner 50 and transferred from the substrate conveying robot 10 to the aligner 50. Furthermore, after lowering the hand 12, the robot control unit 41 retracts the hand 12 to a predetermined home position. Then the aligner 50 aligns the wafer W.

Next, when notified by the aligner control unit 55 that the alignment of the wafer W by the aligner 50 has been completed, the robot control unit 41 positions the hand 12 at a first lower position L1 as shown in FIG. 4. The first lower position L1 is a position below a first target position L3 at which the hand 12 has placed the wafer W on the holding portion 51, and is set, for example, 3 mm below the first target position L3.

Next, the robot control unit 41 controls the vertical drive mechanism 26 to raise the hand 12 from the first lower position L1 to a first upper position L4. The first upper position L4 is set above the first target position L3 at which the hand 12 picks up the wafer W, and is set, for example, 3 mm above the first target position L3. Thus, the wafer W held by the holding portion 51 of the aligner 50 can be picked up.

In addition, in parallel with the raising operation, the robot control unit 41 controls the horizontal drive mechanism 21 to rotate at least one of the plurality of joints at a predetermined angle in one direction in a first interval A1 between the first lower position L1 and a first intermediate position L2. The first intermediate position L2 is set between the first lower position L1 and the first target position L3, and set, for example, 1 mm below the first target position L3. In this embodiment, the joints 61, 62, and 63 of the robot arm 11 are each rotated at a predetermined angle in one direction. At this time, the rotation directions of the joints 61, 62, and 63 may not be the same. Thus, it is possible to eliminate or reduce the backlash of the driving force transmission unit 23. The rotation angle of each of the joints 61, 62, and 63 is preferably equal to or greater than an angle necessary to eliminate the backlash of the driving force transmission unit 23, and is also preferably equal to or less than an angle which causes no interference with the environment. Specifically, a suitable rotation angle during execution of the work of picking up the wafer W is, for example, within a range of equal to or greater than 0.5° and equal to or less than 5°. Further, a suitable rotation angle during execution of the work of placing the wafer W is, for example, within a range of equal to or greater than 0.1° and equal to or less than 5°. Thus, it is possible to suitably improve the positioning accuracy of the hand 12 while avoiding interference with the environment.

Next, the robot control unit 41 moves the hand 12 along a preset path, and as shown in FIG. 5, positions the hand 12 at a second upper position L6 located above a second target position L8 at which the hand 12 places the wafer W on the stage 3. The second upper position L6 is set, for example, 3 mm above the second target position L8.

Next, the robot control unit 41 controls the vertical drive mechanism 26 to lower the hand 12 from the second upper position L6 to a second lower position L9. The second lower position L9 is set below the second target position L8, for example, 3 mm below the second target position L8. Thus, the wafer W can be mounted on the stage 3.

Then, in parallel with the lowering operation, the robot control unit 41 controls the horizontal drive mechanism 21 to rotate at least one of the plurality of joints at a predetermined angle in one direction in a second interval A2 between the second upper position L6 and a second intermediate position L7. The second intermediate position L7 is set between the second upper position L6 and the second target position L8, and set, for example, 1 mm above the second target position L8. In this embodiment, the joints 61, 62, and 63 of the robot arm 11 are each rotated at a predetermined angle in one direction. Thus, even when the wafer W is mounted on the stage 3 as well as when the wafer W is picked up from the holding portion 51, it is possible to eliminate or reduce the backlash of the driving force transmission unit 23 and suppress deviation of the position of the wafer W aligned by the aligner 50. Therefore, it is possible to eliminate or facilitate the work of aligning the wafer W in the substrate processing facility 1.

FIG. 6 shows a measurement result on positioning error of the hand 12 in the operation of picking up the wafer W from the holding portion 51, and shows the improvement ratio of the repeatability ((1—repeatability of operation B/repeatability of operation A)×100) in predetermined operation (operation B) in which the joints of the robot arm 11 are rotated to pick up the wafer W from the holding portion 51, to the repeatability (width between the maximum value of the positional deviation in a positive direction and the maximum value of the positional deviation in a negative direction) in predetermined operation (operation A) in which the wafer W is picked up from the holding portion 51 without rotating operation of the joints of the robot arm 11. Each of the operation A and B was performed at 1%, 5%, and 15% of the maximum operation speed of the robot arm 11, and the repeatability was measured for each operation speed. This measurement result indicates that, in the cases where the joints are rotated to pick up the wafer W, the repeatability has been significantly improved at any operation speed as compared with the cases where the wafer W is picked up without rotating operation of the joints.

As described above, in the substrate processing system 100, when the hand 12 picks up or places the wafer W, the joints 61, 62, and 63 of the robot arm 11 are rotated in one direction. Thus, it is possible to improve the positioning accuracy of the hand 12. In particular, with respect to a hand, such as a passive hand or suction hand in which when the wafer W is held, horizontal positioning of the wafer W with respect to the hand 12 is not performed, it is possible to improve the positioning accuracy in the horizontal direction in addition to the positioning accuracy in a rotation direction. Furthermore, since it is possible to improve the positioning accuracy using a relatively inexpensive driving force transmission unit with large backlash (such as a gear manufactured with general machining accuracy) without using an expensive driving force transmission unit with small backlash (such as a special gear with high machining accuracy), the manufacturing cost can be reduced. This enables the substrate conveying robot 10 to accurately transfer the aligned wafer W to the stage 3. It is therefore possible to eliminate or facilitate the work of aligning the wafer W in the substrate processing facility 1 and smoothly perform the processing of the wafer W in the substrate processing facility 1. As a result, the throughput of the substrate processing system 100 can be improved.

<Modification>

In the above embodiment, the aligner 50 moves the wafer W such that the wafer W is positioned at a predetermined position, but the present invention is not limited thereto. Alternatively, the position detection unit 53 may detect the position of the notch formed on the wafer W or the position of the orientation flat and notify the robot control unit 41 of the detection result. In addition, the robot control unit 41 may adjust the orientation and the horizontal position of the hand 12 when picking up the wafer W on the holding portion 51 based on the detection result so that the wafer W is mounted on the substrate mounting portion 12a at a predetermined rotational position and horizontal position, to pick up the wafer W.

From the above description, many modifications and other embodiments of the present invention will be apparent to those skilled in the art. Accordingly, the above description should be taken as exemplary only, and is provided for the purpose of teaching those skilled in the art the best mode of carrying out the present invention. The structural and/or functional details may be substantially altered without departing from the spirit of the present invention.

What is claimed is:

1. A substrate conveying robot comprising:
   a base;
   a hand that has a substrate mounting portion on which a substrate is mounted;
   an articulated robot arm that has a base end connected to the base and a leading end connected to the hand, and includes a plurality of joints;
   a robot arm drive mechanism that includes a drive source and a driving force transmission unit that transmits driving force of the drive source to the joints of the articulated robot arm to displace the joints; and
   a robot control unit that controls operation of the drive source so that the hand assumes a target orientation at a target position, wherein
   the robot control unit raises the hand from a first lower position below a first target position at which the hand picks up the substrate to a first upper position above the first target position, and rotates at least one of the plurality of joints at a predetermined angle in one direction, in a first interval from the first lower position to a first intermediate position between the first lower position and the first target position.

2. The substrate conveying robot according to claim 1, wherein
   the robot control unit rotates each of the plurality of joints in one direction in the first interval.

3. The substrate conveying robot according to claim 1, wherein
   the substrate conveying robot transfers the substrate held by an aligner to a stage, and
   the first target position is a position to pick up the substrate held by the aligner.

4. The substrate conveying robot according to claim 1, wherein
   the driving force transmission unit includes at least one of a gear, toothed belt, and chain that transmit the driving force to the joints.

5. A substrate conveying robot comprising:
   a base;
   a hand that has a substrate mounting portion on which a substrate is mounted;
   an articulated robot arm that has a base end connected to the base and a leading end connected to the hand, and includes a plurality of joints;
   a robot arm drive mechanism that includes a drive source and a driving force transmission unit that transmits driving force of the drive source to the joints of the articulated robot arm to displace the joints; and
   a robot control unit that controls operation of the drive source so that the hand assumes a target orientation at a target position, wherein
   the robot control unit lowers the hand from a second upper position above a second target position at which the hand places the substrate on a stage to a second lower position below the second target position, and rotates at least one of the plurality of joints at a predetermined angle in one direction, in a second interval from the second upper position to a second intermediate position between the second upper position and the second target position.

6. The substrate conveying robot according to claim 5, wherein
   the robot control unit rotates each of the plurality of joints in one direction in the second interval.

7. The substrate conveying robot according to claim 5, wherein
   the driving force transmission unit includes at least one of a gear, toothed belt, and chain that transmit the driving force to the joints.

8. A substrate conveying method for a substrate conveying robot that comprises:
   a base;
   a hand that has a substrate mounting portion on which a substrate is mounted;
   an articulated robot arm that has a base end connected to the base and a leading end connected to the hand, and includes a plurality of joints; and
   a robot arm drive mechanism that includes a drive source and a driving force transmission unit that transmits driving force of the drive source to the joints of the articulated robot arm to displace the joints, the substrate conveying method comprising:
   positioning the hand at a first lower position below a first target position at which the hand picks up the substrate; and
   raising the hand to a first upper position above the first target position, and rotating at least one of the plurality of joints at a predetermined angle in one direction, in a first interval from the first lower position to a first intermediate position between the first lower position and the first target position.

9. The substrate conveying robot according to claim 1, wherein
   the predetermined angle is set to reduce a backlash of the driving force transmission unit, and is equal to or greater than 0.1° and equal to or less than 5°.

* * * * *